May 25, 1965 B. FREYMODSSON 3,185,947

INDUCTIVE MODULE FOR ELECTRONIC DEVICES

Filed Nov. 16, 1959 3 Sheets-Sheet 1

Inventor:
Bragi Freymodsson
By: Graf, Nierman & Burmeister
Attorneys

May 25, 1965 B. FREYMODSSON 3,185,947

INDUCTIVE MODULE FOR ELECTRONIC DEVICES

Filed Nov. 16, 1959 3 Sheets-Sheet 2

Inventor:
Bragi Freymodsson
By: Graf, Nierman & Burmeister
Attorneys

Inventor:
Bragi Freymodsson
By Graf, Nierman & Burmeister
Attorneys

United States Patent Office 3,185,947

Patented May 25, 1965

3,185,947

INDUCTIVE MODULE FOR ELECTRONIC DEVICES

Bragi Freymodsson, Chicago, Ill., assignor to A.R.F. Products, Inc., River Forest, Ill., a corporation of Illinois Filed Nov. 16, 1959, Ser. No. 853,319
12 Claims. (Cl. 336—200)

The present invention relates to inductances for electronic circuits, and more particularly to micromodule inductances for use in modular construction of electronic devices.

Efforts are constantly being exterted to manufacture electronic equipment in smaller packages. Under the most advanced technique for reducing the size of electronic equipment, the individual components of the equipment are manufactured as thin wafers, and these wafers are stacked or sandwiched together so that the electronic components occupy essentially the entire volume of the equipment container, rather than merely a small portion of the equipment container as has been the case in conventional electronic devices.

Such wafers are provided in standard cross-sectional dimensions, the thickness of the wafers varying in accordance with the requirement of the particular component. Most electronic components for modular construction employ a base wafer to which the electronic component is mounted. Miliary specifications require these base wafers to be square with cross-sectional dimensions of 0.310 inch and a thickness of 0.010 inch. Each wafer has three notches on each side for so-called riser wires. Riser wires are electrical conductors which are fitted within one row of notches along the entire stack of wafers and are electrically connected to so-called land areas on at least a portion of those wafers to interconnect the electronic components and form the electrical circuit. The end wafers generally contain jumper wires to interconnect riser wires, and are otherwise identical to the other wafers.

As indicated in the May 22, 1959, issue of Electronics magazine, the inductors employed heretofore in such micromodule equipment utilize a miniature ferrite toroid which carries a wound coil and is affixed to a supporting or base wafer. To obtain adequate inductance with such a module, the thickness of the module is greater than desired, partly due to the fact that the thickness of the supporting wafer performs only a supporting function and does not contribute to the electrical characteristics of the inductance and partly due to the fact that it is difficult to utilize the entire area of the wafer with this construction. It is therefore one of the objects of the present invention to provide a module which is thinner, or in other words, provides a greater inductance per unit volume than the inductive modules heretofore known.

The smallest micromodules known prior to the present invention employ a hollow ferrite cylinder with an outer diameter of 0.080 inch and a length of 0.030 inch, the inner diameter being 0.050 inch. Fine wire, such as No. 40, is wound about these ferrite cylinders with great difficulty and with the aid of special winding equipment. It is an object of the present invention to provide a micromodule inductor which may be fabricated without the necessity of winding coils, and requires no special techniques. Further, it is an object of the present invention to provide a micromodule inductor by printed circuit techniques.

In accordance with the present invention, the base wafer itself is constructed of a ferromagnetic material which has substantial electrical resistivity, such as ferrite, garnet, or the like, and the electrically conducting windings are applied to the surface or surfaces of the ferrite wafer to provide the necessary inductance.

Further objects and advantages of the present invention will become readily apparent to those skilled in the art upon a further reading of this disclosure, particularly when viewed in the light of the drawings, in which.

Figure 1:
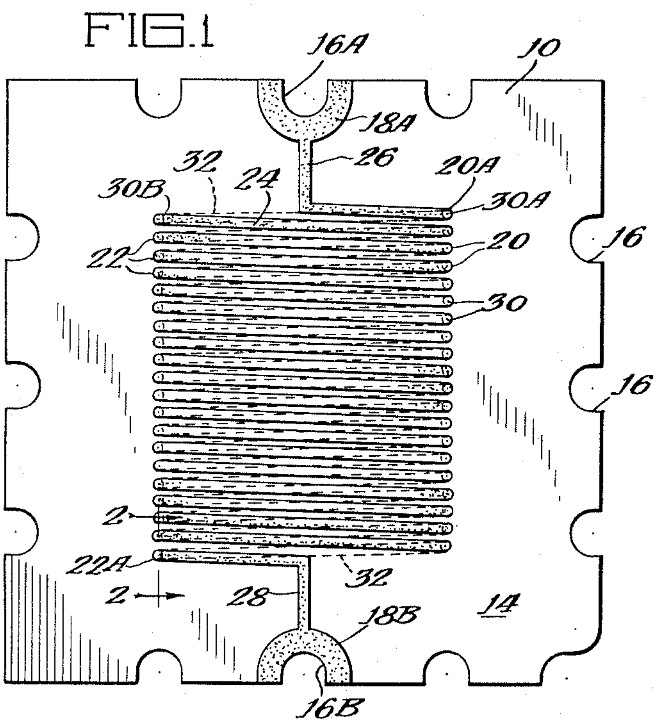
FIGURE 1 is a front elevational view of a micromodule inductor constructed according to the teachings of the present invention.

The module inductor illustrated in FIGURE 1 employs a thin, flat, generally square wafer 10 with parallel front and back surfaces 12 and 14 which are preferably spaced by the optimum distance for mechanical strength and minimum dimensions. Each of the four sides of the wafer 10 is provided with three equally spaced notches 16, and the two notches 16A and 16B, which are to form the electrical contacts to the riser wires of the particular module, are provided with land areas 18A and 18B which are formed by thin coatings of electrically conducting material. Since an inductor requires but two terminals in the absence of taps or additional windings, the wafer 10 is provided with only two land areas 18A and 18B.

The wafer 10 is constructed of ferromagnetic material and also electrically insulating material. The wafer should have at least the resistivity and the magnetic properties of ferrite. A plurality of spaced bores 20 extend through the ferrite wafer 10 in a line, and a second plurality of spaced bores 22 extend through the ferrite wafer in a second line spaced and parallel to the first line of the bores 20. Each of the bores 20 confronts a bore 22, and an electrically conducting strip 24 extends from each bore 20 to each bore 22. The bores 20 are spaced by the same distance, and the bores 22 are also spaced from each other by that distance, so that the electrically conducting strips 24 are parallel to each other. The bore nearest to the notch 16A, designated 20A, is electrically connected to the land area 18A by an electrically conducting strip 26. In like manner, the bore 22 nearest to the notch 16B, designated 22A, is electrically conducting to the land area 18B by an electrically conducting strip 28.

Each of the bores 20 and 22 contains an electrically conducting link 30 in the form of a strip of electrically conducting material which extends between the surfaces 12 and 14 of the wafer 10. The link within the bore 20A, designated 30A, is electrically connected to the confronting link 30B in the bore 22 nearest the notch 16A by an electrically conducting strip 32 which is disposed on the surface 12 of the wafer 10. In like manner, each of the other links 30 disposed within bores 20 are electrically connected to links 30 disposed within bores 22 by strips 32 of electrically conducting material, and all the electrically conducting strips 32 are parallel to each other. In this manner, an electrical circuit is formed from the land area 18A to the land area 18B which winds through the electrically conducting strips 24, the links 30, and the electrically conducting strips 32.

Figure 2:
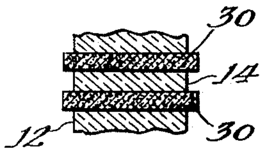
FIGURE 2 is a fragmentary sectional view taken along the line 2—2 of FIGURE 1.

In one particular construction of a module inductor of the type illustrated in FIGURES 1 and 2, the base wafer has a thickness of 0.030 inch and cross-sectional dimensions of 0.310 inch, and the bores 20 and 22 have a diameter of 0.005 inch and are spaced from each other by a distance of approximately 0.009 inch. There are twenty bores 20 and twenty bores 22 disposed on axes spaced by a distance of approximately 0.150 inch and offset from each other by a distance of approximately half the distance between bores in each row. The electrically conducting strips 24 and 32 have a thickness of 0.002 inch and a width of approximately 0.005 inch. The wafer 10 is constructed of ferrite, and the electrically conducting material is copper. Silver or other electrically conducting coatings may also be employed. While the bores 20 and 22 may be formed in the wafer 10 in any known convenient manner, the most satisfactory method found to the present time is to employ a single jig driven by ultrasonic waves for purposes of drilling all forty of the bores at the same time.

Figures 3, 4:
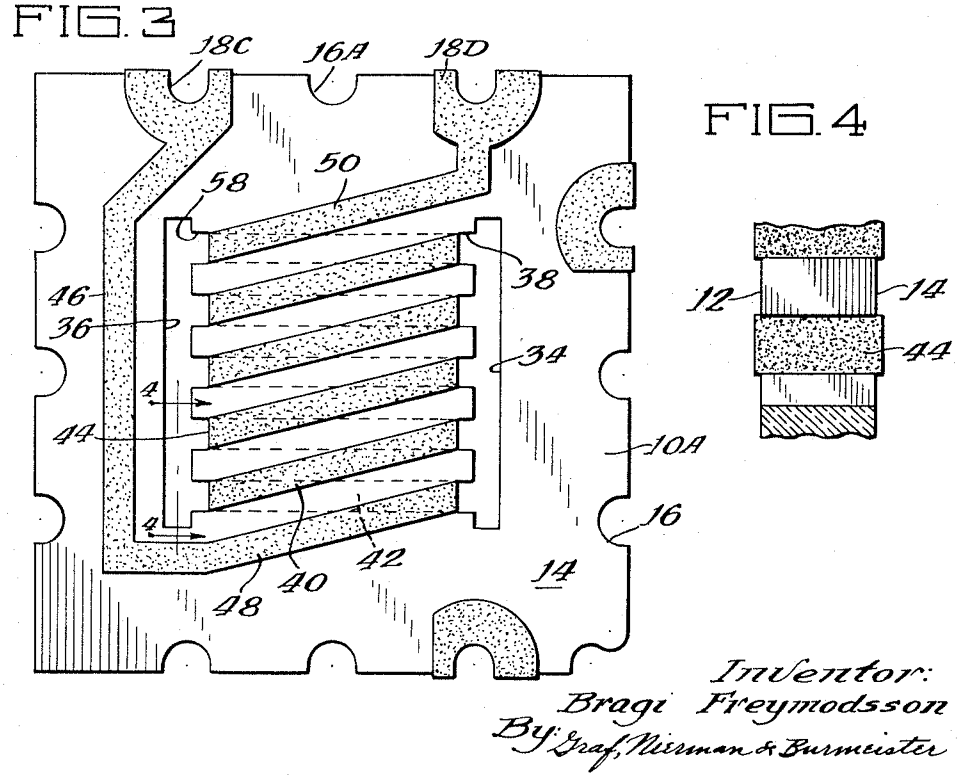
FIGURE 3 is a front elevational view of another embodiment of a module inductor constructed according to the teachings of the present invention.
FIGURE 4 is a fragmentary sectional view taken along the line 4—4 of FIGURE 3.

Due to self-inductance of individual links by reason of closed magnetic paths in the ferrite linking each link, the inductance of the module inductor of FIGURES 1 and 2 is less than the maximum inductance that can be provided with the same number of turns and configuration shown on FIGURES 1 and 2. The embodiment illustrated in FIGURES 3 and 4 minimizes the inductance reduction due to leakage fluxes. Since the embodiment of FIGURES 3 and 4 is in many respects identical to that illustrated in FIGURES 1 and 2, corresponding reference numerals will be used for the same elements. In this embodiment of the invention, a wafer 10A is provided with elongated parallel slots 34 and 36 disposed in parallel confronting relationship, and each of the slots 34 and 36 has an equal number of confronting rectangular indentations 38. A plurality of parallel electrically conductive strips 40 extend between indentations 38 of the slot 34 and the indentations 38 of the slot 36 across the surface 14. In like manner, electrically conducting strips 42 extend between the indentations of the strip 34 and the indentations of the strip 36 on the opposite surface 12 of the wafer 10A. Also, an interconnecting link 44 in the form of a thin coating of electrically conducting material covers the surface of the indentations 38 between the strips 40 and 42 to form a continuous electrical circuit.

As is clear from FIGURE 3, two different land areas 18C and 18D located on the same edge of the wafer 10 as the notch 16A and on opposite sides thereof are employed to form electrical contact with the electrically conducting strips 40 and 42. An electrically conducting strip 46 extends from the land area 18C along the slot 36, and forms the last strip, designated 48, of the coil since it is parallel to the adjacent strip 40 and spaced the proper distance therefrom. In like manner, the strip 50 which extends from the land area 18D is parallel and properly spaced from the adjacent link of the coil to form the last turn thereof at this end of the inductance.

As in the previous embodiment, the wafer 10A is constructed of ferrite, and the electrically conducting strips and links are constructed of silver or copper. The wafer dimensions are as indicated above.

Difficulty has been experienced, and it has been somewhat costly, to provide electrically conducting links 30 or 44 between the surfaces 12 and 14 of the wafer. The embodiment of FIGURES 5 and 6 has proven to facilitate construction of the links between the two surfaces of the ferrite wafer.

The wafer of this embodiment of the invention is designated 10B, and the one surface 14 of the wafer is provided with two elongated spaced grooves designated 52 and 54. The surface 12 opposite the surface 14 is also provided with two identical grooves designated 56 and 58, and the groove 56 is aligned with the groove 52 and the groove 58 is aligned with the groove 54. A thin strip 60 of the wafer extends between the grooves 52 and 56, and a similar strip 62 extends between the grooves 54 and 58. The grooves are each provided with flat surfaces 64 which extend from the strips 60 and 62 to the surfaces 12 and 14 of the wafer 10B, the surfaces 64 being at an angle of approximately 45 degrees relative to the surfaces of the wafer.

A plurality of equally spaced holes 66 is disposed in each of the strips 60 and 62, and the holes 66 extend therethrough. The end hole 66A of the grooves 54 and 58 is connected to the land area 18D by an electrically conducting strip 68, and the end hole 66B of the grooves 52 and 56 is connected to the land area 18C by an electrically conducting strip 70 in the manner of the embodiment of FIGURE 3. An electrically conducting strip 72 extends from each of the holes 66 in the groove 54 across the surface 64 and the surface 14 of the wafer 10B to one of the holes 66 in the groove 52, and in like manner an electrically conducting strip 74 extends from each of the holes 66 in the groove 56 to one of the holes 66 in the groove 58. Each of the holes 66, including the holes 66A and 66B, is provided with a coating 76 of electrically conducting material which forms a cylindrical sleeve to electrically connect the strips 72 on the surface 14 of the wafer 10B to the strips 74 on the surface 12 of the wafer 10B. In this manner, an electrical circuit is formed from the land areas 18C through the electrically conducting strip 70, the coatings 76, the electrically conducting strips 74, the electrically conducting strips 72, and the electrically conducting strip 68 to the land area 18D.

By employing the grooves 52, 54, 56, and 58, the thickness of the strips 60 and 62 of the wafer 10B is relatively thin, and it is substantially easier to provide the electrically conducting coatings 76 on the holes 66 than with other constructions.

Figures 5, 6, 7, 8:
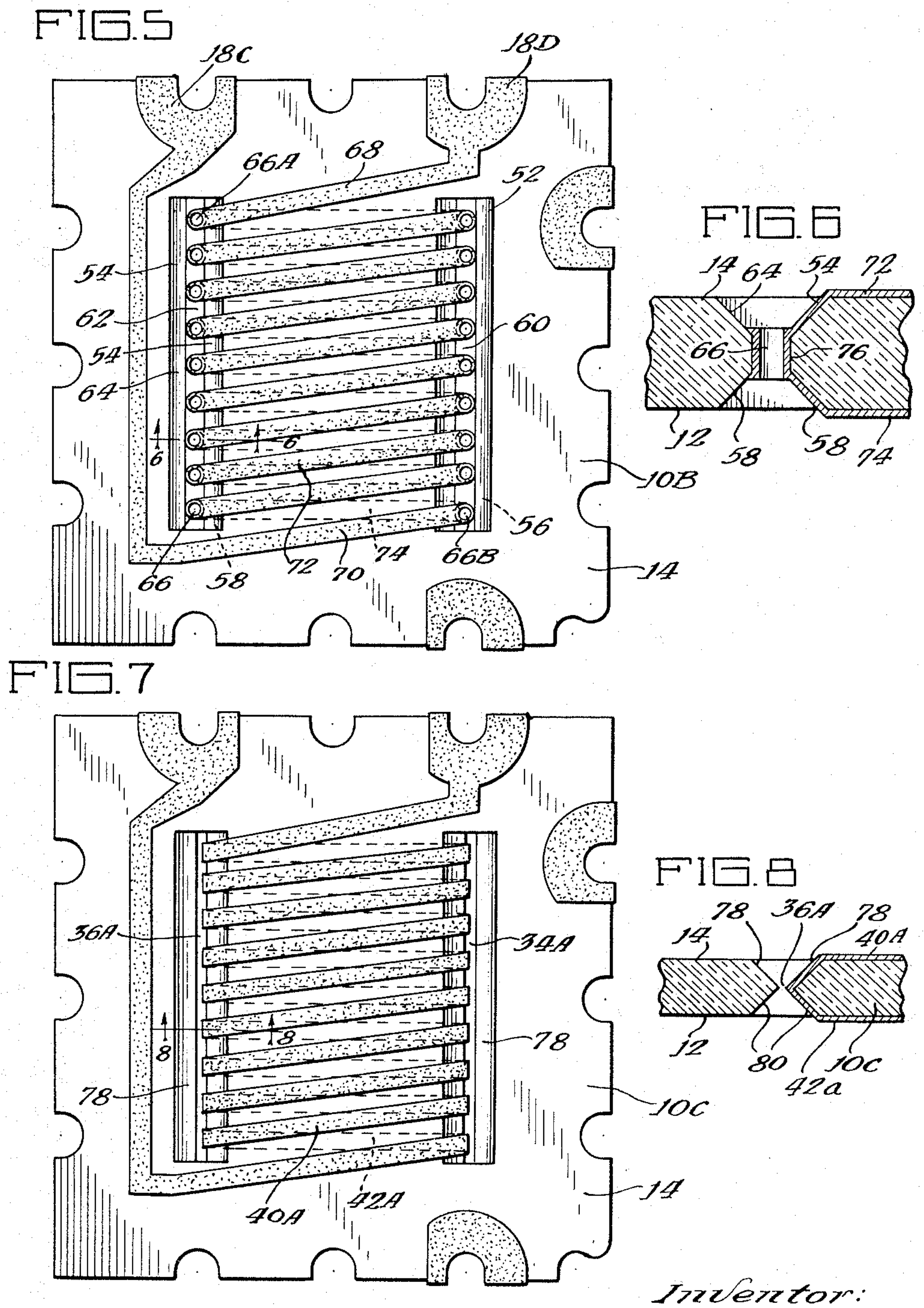
FIGURE 5 is a front elevational view of another embodiment of a module inductor constructed according to the teachings of the present invention.
FIGURE 6 is a fragmentary sectional view taken along the line 6—6 of FIGURE 5.
FIGURE 7 is a front elevational view of a module inductor constituting another embodiment of the present invention.
FIGURE 8 is a fragmentary sectional view taken along the line 8—8 of FIGURE 7.

Like the construction of the embodiment of FIGURES 1 and 2, the above described embodiment of FIGURES 5 and 6 produces an inductance somewhat less than the theoretical calculated inductance as a result of eddy current losses. The embodiment of FIGURES 7 and 8 is designed to minimize eddy current losses. This embodiment employs a wafer 10C which somewhat resembles the wafer 10A of FIGURES 3 and 4 in that it also is provided with a pair of parallel slots 34A and 36A which extend from the surface 12 of the wafer to the surface 14 thereof. The slots 34A and 36A, however, differ from the slots shown in FIGURES 3 and 4 in that the slots are formed by two elongated flat surfaces 78 extending into the wafer 10C at an angle relative to and from the surface 14, and a second pair of flat surfaces 80 extending into the wafer 10C from the opposite surface 12 of the wafer 10C. The surfaces 78 and 80 intersect along two parallel axes which are spaced from each other to form the gaps 36A and 34A. Electrically conducting strips 40A and 42A, similar to the strips 40 and 42 of FIGURES 3 and 4, extend across the surfaces 12 and 14 of the wafer 10C, respectively, and also traverse the surfaces 78 and 80 to form a continuous electrical circuit in the manner previously described.

Figure 9:
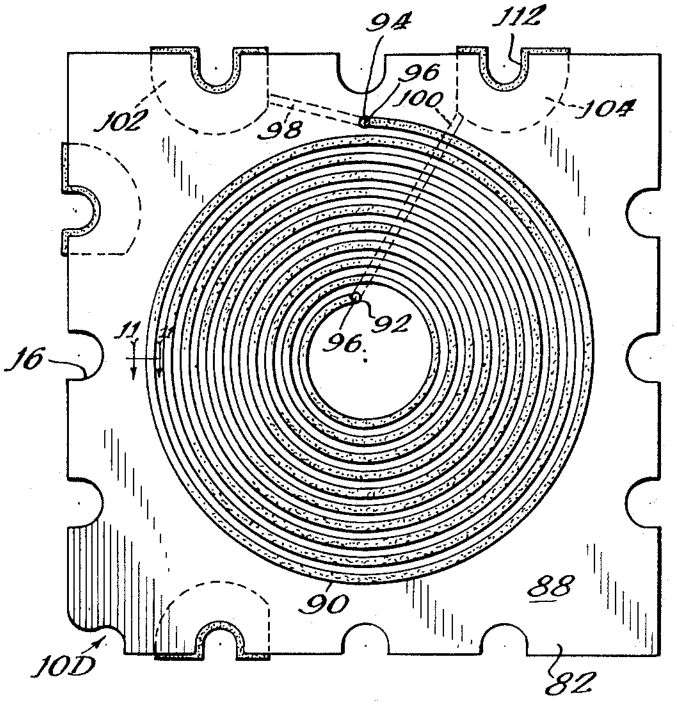
FIGURE 9 is a front elevational view of still another embodiment of the present invention.
Figure 10:
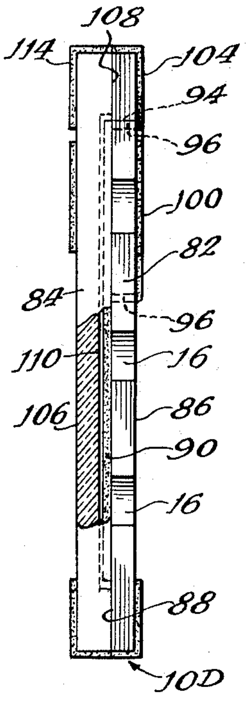
FIGURE 10 is a side elevational view partly cut away and in section.

FIGURES 9 and 10 show still another embodiment from the present invention. In this embodiment of the invention, the wafer designated 10D is formed of two parts, 82 and 84. The part 82 carries the inductance portions of the device, while the part 84 is a cup-shaped member which encloses the inductance and forms a ferrite path for the field.

The part 82 of the wafer 10D has two parallel surfaces 86 and 88. A spiral coil 90 protrudes from the surface 88 and extends coaxially about the center of the plate 82. The plate 82 is provided with an aperture 92 at the helical inner end of the coil 90 and a second aperture 94 at the peripheral end of the helical coil 90. Electrically conducting links 96 extend through the apertures 92 and 94 to the surface 86, and electrically conducting strips 98 and 100 extend from the links 96 in the apertures 92 and 94 to land areas 102 and 104 mounted on the surface 86 of the plate 82.

The portion 84 of the wafer 10D, referred to as the cup, has a surface 106 which is parallel to a second surface 108. The surface 108 of the cup 84 abuts the surface 88 of the plate 82, and a circular indentation 110 is disposed in the surface 108 and accommodates the protruding spiral coil 90. Both the plate 82 and the cup 84 are provided with notches 16, and electrically conducting layers 112 extend from the land areas 102 and 104 on the plate 82 to land areas 114 on the surface 106 of the cup 84.

With the construction illustrated in FIGURES 9 and 10, the wafer is fabricated in two parts and cemented together. The spiral coil 90 is relatively easily provided on the surface 88 of the plate 86 by electroplating or vacuum techniques, and since only two links 96 are required, the circuit is relatively easily completed.

Figure 11:
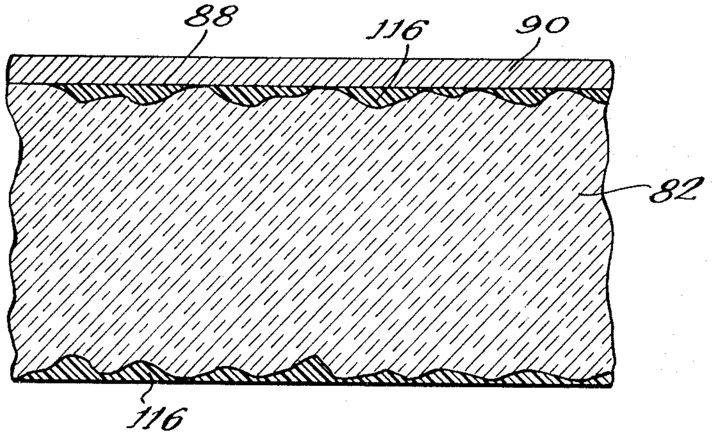
FIGURE 11 is a fragmentary sectional view taken along the line 11—11 of FIGURE 9.

Because of the fact that the magnetic permeability of the wafer is important in an inductor, ferrite or garnet have been used for the wafers. Both ferrite and garnet are relatively porous materials and as a result difficult to plate. If either an etching or vacuum deposition process is employed to provide the electrical conductors on the wafer, it is necessary for the surfaces of the wafer to be very smooth and flat, and ferrite by its nature is relatively rough. FIGURE 11 illustrates a construction which facilitates plating the relatively rough surfaces of the wafer. While FIGURE 11 is indicated as a fragmentary sectional view of FIGURE 9, it is to be understood that the construction here disclosed is equally applicable to the other embodiments set forth in FIGURES 1 through 8.

The electrically conducting coating 90, which in this illustration is the spiral coil of the inductor, but could equally be any other thin layer of electrically conducting material, is shown disposed on one of the surfaces 88 of the plate 82 which is ferrite. In order to obtain a flat surface for the conductor 90, the spaces between the surface are filled with plastic material designated 116. This plastic material 116 should not be lossy and should provide electrical resistance at least as good as that of the plate 82. The plastic material 116 is coated on the ferrite plate 82 prior to lapping the plate to provide parallel surfaces. It is to be noted that the entire plastic layer is removed from the plate 82 over a portion of its surface, so that the only portions of plastic remaining fill the pores of the plate 82. It is preferable to coat the ferrite plate 82, rather than impregnate the plate, since any plastic material will have higher losses than air, and in this manner the inner pores of the plate 82 are left without plastic filling. It has been found that polyvinyl chloride is a suitable material for the plastic coating, although many other plastics are also suitable.

From the foregoing disclosure, those skilled in the art will readily devise many modifications to the devices herein disclosed. It is also clear that the present invention may be adapted to many additional utilities, such as fabrication of transformers, saturable reactors, and the like. It is therefore intended that the scope of the present invention be not limited by the foregoing disclosure, but rather only by the appended claims.

The invention claimed is:

1. An inductance module comprising a thin wafer having first and second parallel surfaces and at least two notches extending therein from the periphery thereof, said wafer being constructed of material having at least the electrical resistivity of ferrite and a magnetic reluctance no greater than ferrite, an electrically conducting strip disposed on the surface of the wafer forming a coil, the coil being spiral in form and totally disposed on one surface of the wafer, electrically conducting land areas at the two notches, and electrical conductors extending from the ends of the coil to the land areas.

2. An inductance module comprising a wafer having first and second parallel surfaces and at least two notches extending therein from the perimeter thereof, said wafer being constructed of material having at least the electrical resistivity of ferrite and a magnetic reluctance no greater than ferrite, said wafer having a plurality of holes extending therethrough disposed on a first and a second axis spaced from each other, a first electrically conducting strip disposed on one surface of the wafer between each hole located on the first axis and one of the holes located on the second axis, a second electrically conducting strip disposed on the other surface of the wafer between each hole of the second axis and a hole of the first axis, electrically conducting links extending through each of the holes from the first strip to the second strip, electrically conducting land areas at the two notches, and electrical conductors extending from the ends of the coil to the land areas.

3. An inductance module comprising the elements of claim 2 wherein the wafer is provided with grooves extending therein from each of the surfaces along each of the axes thereof, the grooves having surfaces disposed at an acute angle to the surfaces of the wafer and forming a thin region through which the holes extend.

4. An inductance module comprising the elements of claim 3 wherein the links comprise hollow cylindrical shaped coatings disposed on the surfaces of the holes.

5. An inductance module comprising a thin wafer having first and second parallel surfaces and at least two notches extending therein from the perimeter thereof, said wafer being constructed of material having at least the electrical resistivity of ferrite and a magnetic reluctance no greater than ferrite, said wafer being provided with two elongated spaced slots extending therethrough, a plurality of parallel spaced electrically conducting strips disposed on the first surface of the wafer and extending between the slots therein, a second plurality of parallel spaced electrically conducting strips disposed on the second surface of the wafer and extending between the slots thereof, a plurality of electrically conducting links disposed on the surface of each of the slots and extending between the electrically conducting strips on the first and second parallel surfaces of the wafer to form a continuous electrically conducting coil, electrically conducting land areas at the two notches, and electrical conductors extending from the ends of the coil to the land areas.

6. An inductance module comprising the elements of claim 5 wherein each of the slots is provided with a plurality of spaced indentations extending toward the other slot, the electrically conducting strips of the first and second parallel surfaces of the wafer terminating at the indentations of the slots, and the electrically conducting links between the surfaces of the wafer comprising thin electrically conducting coatings disposed on the surface of the indentations between the electrically conducting strips on the first and second parallel surfaces of the wafer.

7. An inductance module comprising the elements of claim 5 wherein the surface of each of the slots confronting the other slot is formed by two flat surfaces intersecting centrally of the wafer and disposed at an angle relative to each other.

8. An inductance module comprising a wafer having a plate portion and a cup portion, each portion having parallel first and second surfaces and at least two notches extending therein from the perimeter thereof, said wafer being constructed of material having at least the electrical resistivity of ferrite and a magnetic reluctance no greater than ferrite, an electrically conducting spiral strip disposed coaxially about the center of the first surface of the plate portion, electrically conducting land areas at the notches of the plate portion, said plate portion being provided with first and second apertures extending therethrough located at the ends of the spiral strip, two electrical conductors secured to the second surface of the plate portion opposite the spiral, the first electrical conductor extending from the first aperture to one of the land areas and the second electrical conductor extending from the second aperture to the other land area, a first electrically conducting link disposed between one end of the spiral and extending through the first aperture to the first electrical conductor, a second electrically conducting link disposed between the other end of the spiral and extending through the second aperture to the second electrical conductor, the cup portion of the wafer abutting the surface of the plate portion supporting the spiral strip and the cup portion having a circular indentation accommodating the spiral strip.

9. An inductance module comprising a wafer having first and second parallel surfaces and at least two notches extending therein from the perimeter thereof, said wafer being constructed of material having a magnetic reluctance no greater than ferrite, a coating of electrical resistance material disposed on the first surface of the wafer, the coating and wafer forming a surface substantially flat, and an electrically conducting strip disposed on the surface of the coating and wafer forming a coil, electrically conducting land areas at the two notches, and electrical conductors extending from the ends of the coil to the land areas.

10. An inductance module comprising the elements of claim 9 wherein the body is provided with a coating of insulating material on the second surface thereof and the second surface thereof is essentially flat, said wafer having a plurality of apertures extending therethrough and the electrically conducting strips being disposed on both surfaces of the wafer and extending through the apertures to form a continuous coil about the wafer.

11. An inductance module comprising the elements of claim 9 wherein the coil is in spiral form and totally disposed on the flat surface of the coating and wafer.

12. An inductance for use in electrical circuits comprising a thin wafer having first and second parallel surfaces, said wafer being constructed of material having at least the electrical resistivity of ferrite and a magnetic reluctance no greater than ferrite, said wafer being provided with two elongated spaced slots extending therethrough, a plurality of parallel spaced electrically conducting strips disposed on the first surface of the wafer and extending between the slots thereof, a second plurality of parallel spaced electrically conducting strips disposed on the second surface of the wafer and extending between the slots thereof, and a plurality of electrically conducting links disposed on the surface of each of the slots and extending between the electrically conducting strips on the first and second surfaces of the wafer to form a continuous electrically conducting coil.

References Cited by the Examiner

UNITED STATES PATENTS

| | | | |
|---|---|---|---|
| 2,739,371 | 3/56 | Grisdale et al. | 29—155.57 |
| 2,865,086 | 12/58 | Whipple | 29—155.57 |
| 2,905,744 | 9/59 | Rayburn | 317—101 X |
| 2,907,924 | 10/59 | Lutton | 317—101 |
| 2,910,662 | 10/59 | Rex | 336—200 |
| 2,937,351 | 5/60 | Craig | 336—200 |
| 2,943,956 | 7/60 | Robinson | 317—101 X |
| 2,971,138 | 2/61 | Meisel et al. | 317—101 X |

FOREIGN PATENTS

| | | |
|---|---|---|
| 1,107,665 | 8/55 | France. |

JOHN F. BURNS, *Primary Examiner.*

MILTON O. HIRSHFIELD, *Examiner.*